(12) United States Patent
Nishimura

(10) Patent No.: US 12,292,681 B2
(45) Date of Patent: May 6, 2025

(54) IMPRINT METHOD, IMPRINT APPARATUS, AND METHOD OF MANUFACTURING ARTICLE

(71) Applicant: CANON KABUSHIKI KAISHA, Tokyo (JP)

(72) Inventor: Naosuke Nishimura, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1 day.

(21) Appl. No.: 17/949,296

(22) Filed: Sep. 21, 2022

(65) Prior Publication Data

US 2023/0097588 A1    Mar. 30, 2023

(30) Foreign Application Priority Data

Sep. 28, 2021    (JP) .................................. 2021-158395

(51) Int. Cl.
*G03F 7/00*    (2006.01)
(52) U.S. Cl.
CPC .................................. *G03F 7/0002* (2013.01)
(58) Field of Classification Search
None
See application file for complete search history.

(56) References Cited

U.S. PATENT DOCUMENTS

| 7,636,999 B2 | 12/2009 | Choi et al. |
| 11,315,901 B2 | 4/2022 | Zinner et al. |
| 2011/0014314 A1* | 1/2011 | Babbs ..................... B82Y 10/00 425/385 |
| 2020/0168580 A1* | 5/2020 | Zinner .............. H01L 21/67288 |

FOREIGN PATENT DOCUMENTS

| JP | 2008537513 A | 9/2008 |
| KR | 1020090004910 A | 1/2009 |
| KR | 1020210086727 A | 7/2021 |
| WO | 2006083520 A2 | 8/2006 |
| WO | 2007126767 A2 | 11/2007 |

* cited by examiner

*Primary Examiner* — Robert J Grun
(74) *Attorney, Agent, or Firm* — ROSSI, KIMMS & McDOWELL LLP

(57) ABSTRACT

The present invention provides an imprint method of forming, using a mold, a pattern of an imprint material on a substrate having a dimension smaller than a dimension of a holding surface of a substrate stage, comprising: causing the holding surface to hold a plate; causing the plate to support the substrate, by causing the holding surface to hold the substrate by via the plate; bringing the mold into contact with the imprint material on the substrate; curing the imprint material on the substrate; and separating the mold from the cured imprint material, wherein holding of the plate by the substrate stage is controlled while maintaining supporting of the substrate by the plate, such that the substrate is deformed into a convex shape together with the plate upon in the separating.

10 Claims, 12 Drawing Sheets

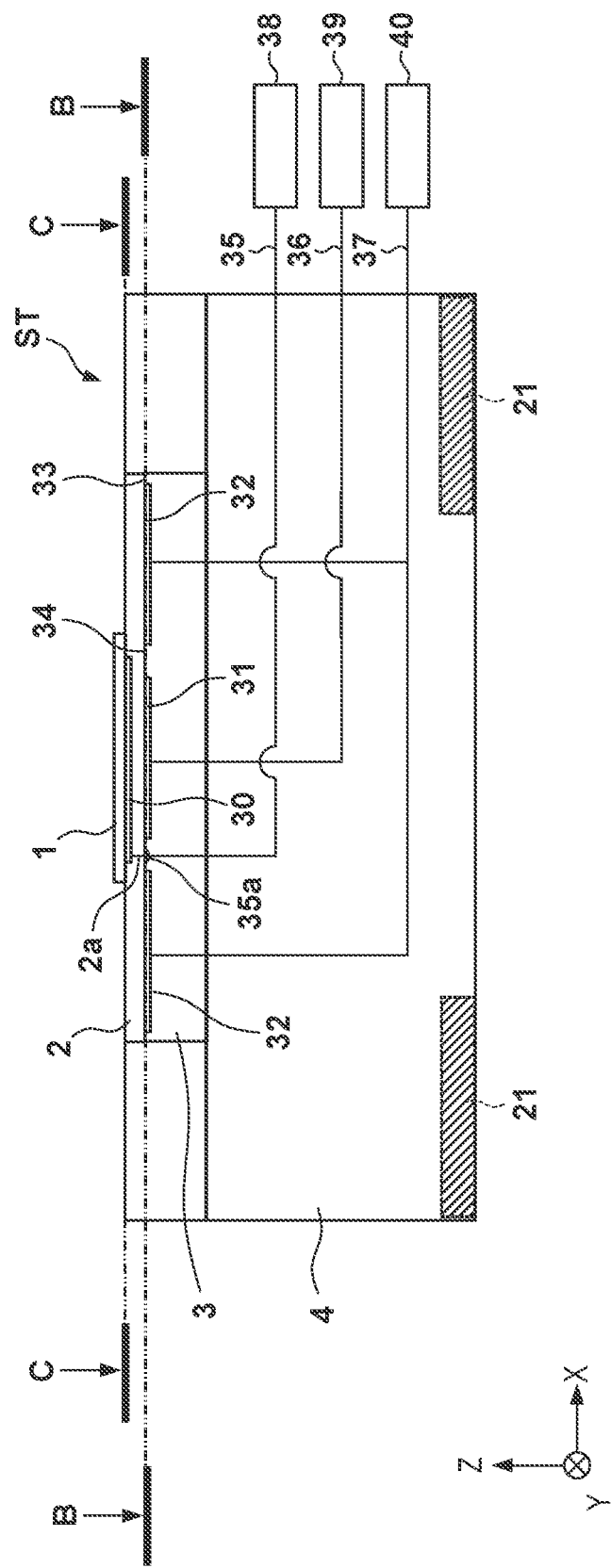

IMPRINT METHOD, IMPRINT APPARATUS, AND METHOD OF MANUFACTURING ARTICLE

BACKGROUND OF THE INVENTION

Field of the Invention

The present invention relates to an imprint method, an imprint apparatus, and a method of manufacturing an article.

Description of the Related Art

An imprint technique of forming a pattern of an imprint material on a substrate using a mold is known as a technique of forming a fine pattern on a substrate. In the imprint technique, a liquid imprint material is supplied onto a substrate, and a mold is brought into contact with the imprint material on the substrate. Thereafter, the imprint material is cured in that state, and the mold is separated (released) from the cured imprint material. With this operation, a pattern of the imprint material can be formed on the substrate.

In the imprint technique, in a separation step of separating the mold from the cured imprint material, a distortion or a defect may be generated in the pattern of the imprint material formed on the substrate. Japanese Patent Laid-Open No. 2008-537513 proposes a technique of locally deforming the substrate into a convex shape in the separation step to reduce a distortion and a defect in a pattern with convex and concave portions, which are generated in the separation step.

The imprint technique may be applied to a substrate (to be sometimes referred to as a small-diameter substrate hereinafter) having a dimension smaller than the dimension of the holding surface of a substrate stage. In this case, if the small-diameter substrate is deformed into a convex shape in the separation step as described in Japanese Patent Laid-Open No. 2008-537513, the holding force for holding the small-diameter substrate by the holding surface of the substrate stage can become insufficient with respect to the mold separation force for separating the mold. As a result, the small-diameter substrate may come off the substrate stage along with the separation of the mold.

SUMMARY OF THE INVENTION

The present invention provides, for example, a technique advantageous in accurately forming a pattern of an imprint material on a substrate having a dimension smaller than the dimension of the holding surface of a substrate stage.

According to one aspect of the present invention, there is provided an imprint method of forming, using a mold, a pattern of an imprint material on a substrate having a dimension smaller than a dimension of a holding surface of a substrate stage, the method comprising: causing the holding surface of the substrate stage to hold a plate having a dimension larger than the dimension of the substrate; causing the plate to support the substrate, by causing the holding surface of the substrate stage to hold the substrate by via the plate; bringing the mold into contact with the imprint material supplied onto the substrate; curing the imprint material on the substrate; and separating the mold from the cured imprint material, wherein holding of the plate by the substrate stage is controlled while maintaining supporting of the substrate by the plate, such that the substrate is deformed into a convex shape together with the plate upon in the separating.

Further features of the present invention will become apparent from the following description of exemplary embodiments with reference to the attached drawings.

BRIEF DESCRIPTION OF THE DRAWINGS

FIG. 3 is a schematic sectional view of the substrate stage according to the first embodiment.

DESCRIPTION OF THE EMBODIMENTS

Figure 1:
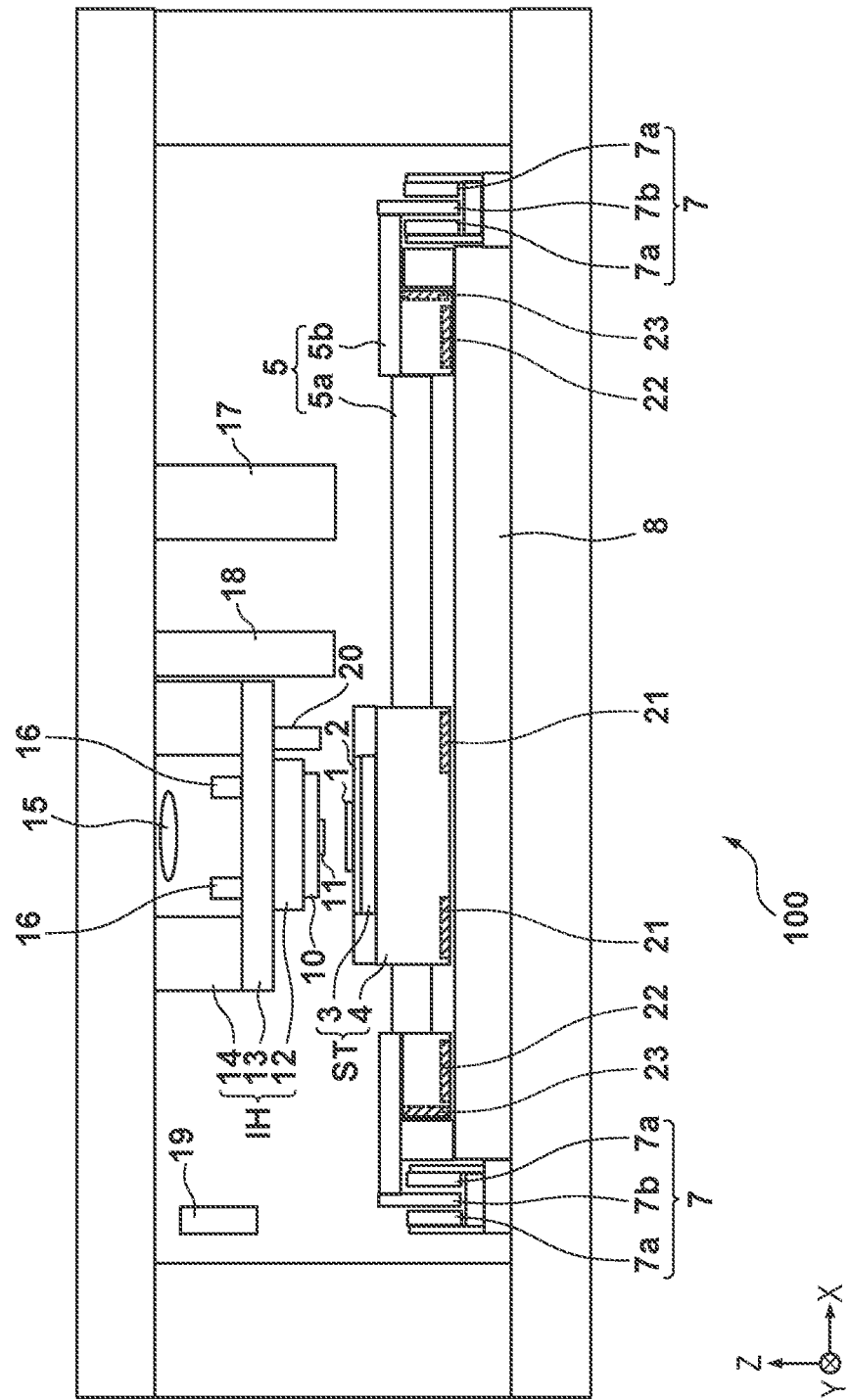
FIG. 1 is a schematic view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate.

Furthermore, in the attached drawings, the same reference numerals are given to the same or similar configurations, and redundant description thereof is omitted.

First Embodiment

The first embodiment according to the present invention will be described. An imprint apparatus is an apparatus that brings a mold into contact with an imprint material supplied onto a substrate and applies curing energy to the imprint material, thereby forming a pattern of a cured product to which a pattern with convex and concave portions of the mold has been transferred. For example, the imprint apparatus supplies a liquid imprint material as a plurality of droplets onto a substrate and, in a state in which a mold formed with a pattern with convex and concave portions is in contact with the imprint material on the substrate, irradiates the imprint material with light to cure the imprint material. Then, the imprint apparatus increases the gap (spacing) between the mold and the substrate to separate (release) the mold from the cured imprint material. Thus, the pattern of the mold can be transferred to the imprint material on the substrate. Such a series of processes is called an "imprint process", and is performed for each of a plurality of shot regions of the substrate.

As the imprint material, a curable composition (to be also referred to a resin in an uncured state) that is cured by receiving curing energy is used. As the curing energy, an electromagnetic wave, heat, or the like is used. The electromagnetic wave is light selected from the wavelength range of 10 nm (inclusive) to 1 mm (inclusive), for example, infrared light, a visible light beam, ultraviolet light, or the like.

The curable composition is a composition cured by light irradiation or heating. A photo-curable composition cured by light contains at least a polymerizable compound and a photopolymerization initiator, and may contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa's (inclusive).

[Arrangement of Imprint Apparatus]

Figure 2:
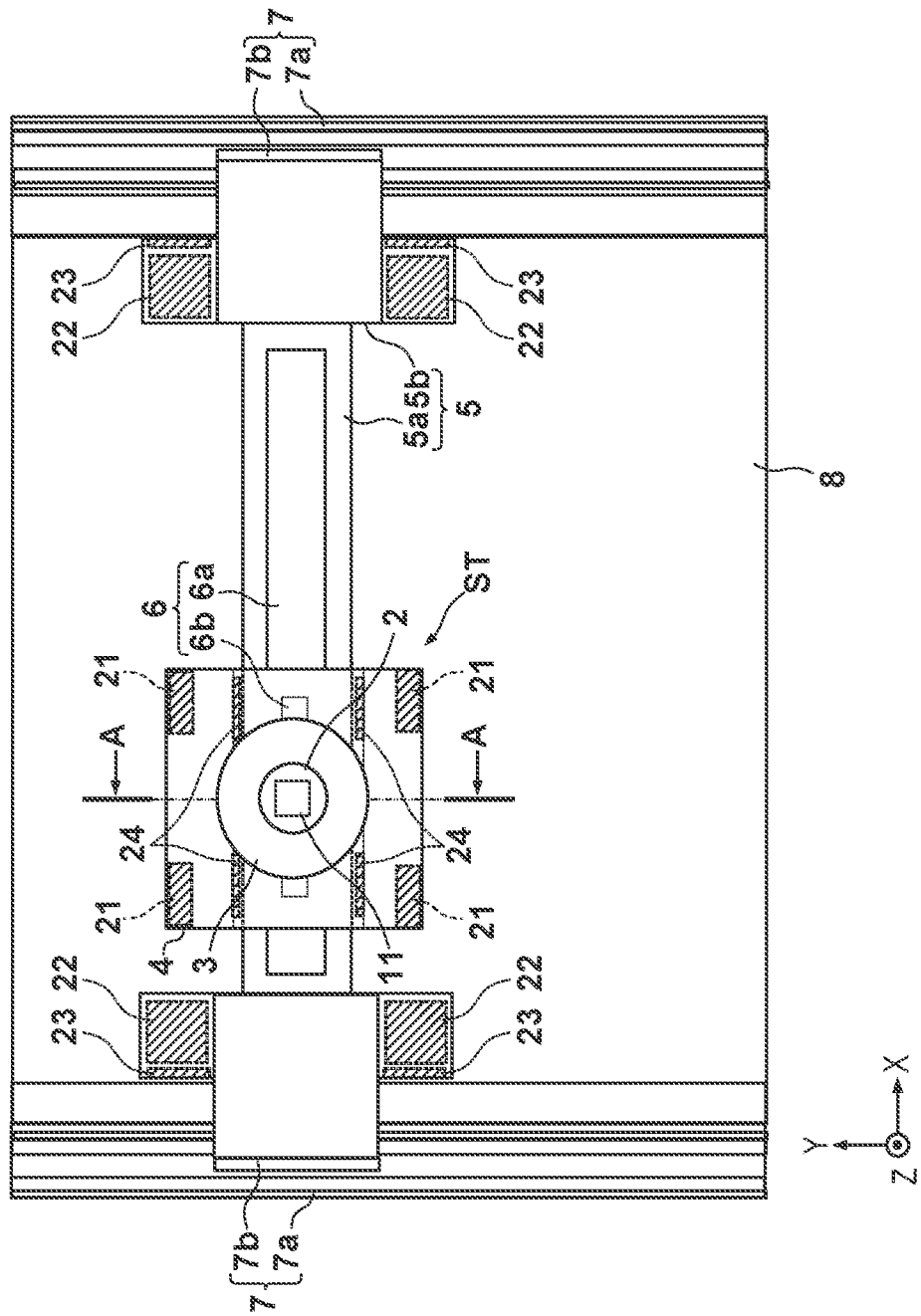
FIG. 2 is a top view of a substrate stage.

The arrangement of an imprint apparatus 100 according to this embodiment will be described with reference to FIGS. 1 and 2. FIG. 1 is a schematic view showing the arrangement of the imprint apparatus 100 according to this embodiment. FIG. 2 is a top view of a substrate stage ST. In the following description, directions orthogonal to each other in a plane parallel to the upper surface of the substrate 1 are defined as an X-axis direction and a Y-axis direction, respectively, and a direction perpendicular to the surface of the substrate 1 is defined as a Z-axis direction. Note that the "X-axis direction" can be defined as including the +X direction and the −X direction. This also applies to the "Y-axis direction" and the "Z-axis direction".

The imprint apparatus 100 according to this embodiment can include, for example, the substrate stage ST capable of moving while holding the substrate 1, an imprint head IH that holds a mold 10, an irradiator 15, a first measurement device 16, a second measurement device 17, a supplier 18, and a controller 19. The controller 19 is formed by, for example, a computer including a CPU, a memory, and the like. The controller 19 controls respective units of the imprint apparatus 100, and controls an imprint process on each of a plurality of shot regions in the substrate 1.

The mold 10 is usually formed from a material capable of transmitting ultraviolet light, such as quartz. In the mold 10, a pattern with convex and concave portions to be transferred to an imprint material on a substrate is formed in a partial region (pattern region 11) on the substrate-side surface. The pattern region 11 has a mesa shape having a level difference of, for example, about several tens of μm. As the substrate 1, glass, ceramic, a metal, a semiconductor, a resin, or the like is used. A member made of a material different from that of the substrate may be formed on the surface of the substrate, as needed. More specifically, the substrate 1 is a silicon wafer, a semiconductor compound wafer, silica glass, or the like. An adhesive layer may be provided before the application of an imprint material to improve the adhesiveness between the imprint material and the substrate, as needed.

The substrate stage ST is configured to be capable of moving while holding the substrate 1 by a holding surface. The substrate stage ST can include, for example, a substrate chuck 3 that generates a holding force such as a vacuum pressure in the holding surface and holds the substrate 1 by the holding surface, and a movable member 4 that can support the substrate chuck 3 and move in the X and Y directions on a base 8. The holding surface of the substrate chuck 3 may be understood as the top surface (the surface on which the substrate 1 is placed) of the substrate chuck 3. The movable member 4 is provided with air guides 21 each of which ejects compressed air toward the base 8 to cause the movable member 4 to float up from the base 8. The movable member 4 is driven by a driving mechanism including a beam member 5, a first driver 6, and a second driver 7. With this arrangement, the movable member 4 can move in the X and Y directions along the upper surface of the base 8 while floating up from the base 8.

The beam member 5 is a member extending in the X direction to guide movement of the movable member 4 in the X-axis direction, and arranged so as to go through an opening (concave portion) provided in the movable member 4. The beam member 5 can include a guide portion 5a that guides movement of the movable member 4, and support portions 5b that support the guide portion 5a in both ends (X-axis direction) of the guide portion 5a. Each support portion 5b is provided with a mover 7b of the second driver 7 (to be described later) and air guides 22 and 23. The air guide 22 ejects compressed air toward the base 8 to cause the beam member 5 to float up from the base 8, and the air guide 23 ejects compressed air toward a stator 7a of the second driver 7 to position the beam member 5 in the X-axis direction. Further, as shown in FIG. 2, air guides 24 are provided in the side surfaces (the surfaces on the beam member 5 side) of the opening provided in the movable member 4. By ejecting compressed air from the air guides 24 toward the side surfaces of the beam member 5 (guide portion 5a), the movable member 4 can be positioned with respect to the beam member 5.

The first driver 6 drives the movable member 4 in the X-axis direction along the beam member 5. The first driver 6 can include, for example, a linear motor formed from a stator 6a including a plurality of coils arrayed along the X-axis direction and a mover 6b including a permanent magnet. In this embodiment, as shown in FIG. 2, the stator 6a of the first driver 6 is provided in the beam member 5 (guide portion 5a), and the mover 6b is provided in the movable member 4. The second driver 7 drives the beam member 5 in the Y-axis direction. The second driver 7 can include, for example, a linear motor formed from the stator 7a including a plurality of coils arrayed along the Y-axis direction and the mover 7b including a permanent magnet. In this embodiment, the mover 7b of the second driver 7 is provided in the support portion 5b of the beam member 5.

Here, the substrate 1 used in this embodiment is a substrate (small-diameter substrate) having a dimension smaller than the dimension of the holding surface of the substrate stage ST (substrate chuck 3). The substrate 1 is held by the substrate stage ST via a plate 2 having a dimension larger than the dimension of the substrate 1, and supported by the plate 2. The plate 2 is also referred to as an intermediate tray plate. The plate 2 has a dimension that can cover the holding surface of the substrate stage ST, and is held by the holding surface of the substrate stage ST with a holding force such as a vacuum pressure. Further, the plate 2 is configured to support (hold) the substrate 1 with a vacuum pressure supplied from the substrate stage ST. By using the plate 2 as described above, even the substrate 1 having the dimension smaller than the dimension of the holding surface of the substrate stage ST can be held by the substrate stage ST, and the substrate stage ST can drive the substrate 1 in the X and Y directions. Note that, as an example, the dimension (diameter) of the plate 2 can be of 12 inches which is equal to the outer shape of the holding surface of the substrate stage ST, and the dimension (diameter) of the substrate 1 can be 8 of inches or less, which is smaller than the dimension of the plate 2. The specific arrangement of the plate 2 will be described later.

The imprint head IH can include, for example, a mold chuck 12, a mold stage 13, and a mold driving device 14. The mold chuck 12 is supported by the mold stage 13, and holds the mold 10 with a holding force such as a vacuum pressure. Each of the mold chuck 12 and the mold stage 13 is provided with an opening (not shown) which allows light from the irradiator 15 to pass therethrough. The mold stage 13 may also be provided with a sensor 20 that detects the height of the substrate 1 held by the substrate stage ST, and a load cell (not shown) that detects the pressure upon imprinting (pressing) the mold 10 against the imprint material on the substrate.

The mold driving device 14 includes an actuator for elevating the mold, and drives the mold 10 in the Z-axis direction together with the mold chuck 12 and the mold stage 13. More specifically, the mold driving device 14 has a function of driving the mold 10 in the Z-axis direction so as to bring the mold 10 into contact with the imprint material on the substrate or separate (release) the mold 10 from the cured imprint material. The mold driving device 14 may also have a function of correcting the inclination (posture) of the mold 10 in accordance with the substrate 1.

The irradiator (curing device) 15 irradiates the imprint material with light (for example, ultraviolet light) via the mold 10 in a state in which the mold 10 and the imprint material on the substrate are in contact with each other, thereby curing the imprint material. The irradiator 15 can include, for example, a light source and an optical system (collimator lens and the like) that shapes light emitted from the light source.

The first measurement device 16 can include, for example, a TTM (Through The Mold) scope provided on the mold stage 13. More specifically, the first measurement device 16 includes an optical system and an imaging system used to detect, via an alignment mark provided on the mold 10, a reference mark provided on the substrate stage ST and/or an alignment mark provided on the substrate 1. Based on a detection result of the TTM scope, the first measurement device 16 measures the relative position between the mold 10 and the substrate 1 (each shot region) in the X and Y directions and/or the relative position between the mold 10 and the substrate stage ST.

The second measurement device 17 can include an off-axis scope including an optical system and an imaging system used to detect, without going through the mold 10, the reference mark provided on the substrate stage ST and/or the alignment mark provided on the substrate 1. Based on a detection result of the off-axis scope, the second measurement device 17 measures the relative position between the mold 10 and the substrate 1 (each shot region) in the X and Y directions and/or the relative position between the mold 10 and the substrate stage ST. Thus, the controller 19 can control alignment between the mold 10 and the substrate 1 based on the measurement result of the first measurement device 16 and/or the measurement result of the second measurement device 17.

The supplier 18 includes a dispenser including a discharge outlet that discharges an imprint material (for example, a photo-curable resin), and supplies the imprint material onto a substrate by causing the dispenser to discharge (drop) the imprint material. The supplier 18 (dispenser) employs, for example, a piezo jet method, a micro solenoid method, or the like, and discharges the imprint material as a plurality of droplets each having a small volume while the substrate 1 is moved by the substrate stage ST in the X and Y directions. Thus, the supplier 18 can supply the imprint material onto the substrate (onto each shot region).

Figure 4A:
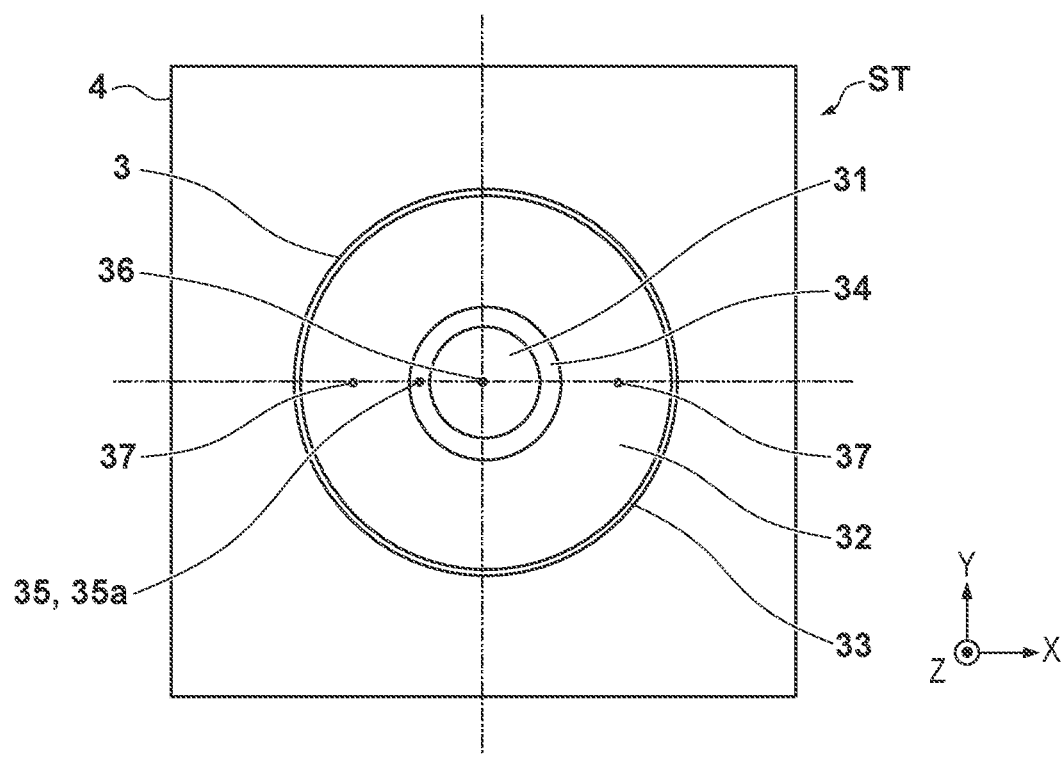
FIGS. 4A and 4B are top views of a holding surface of the substrate stage and a plate, respectively, according to the first embodiment.
Figure 4B:
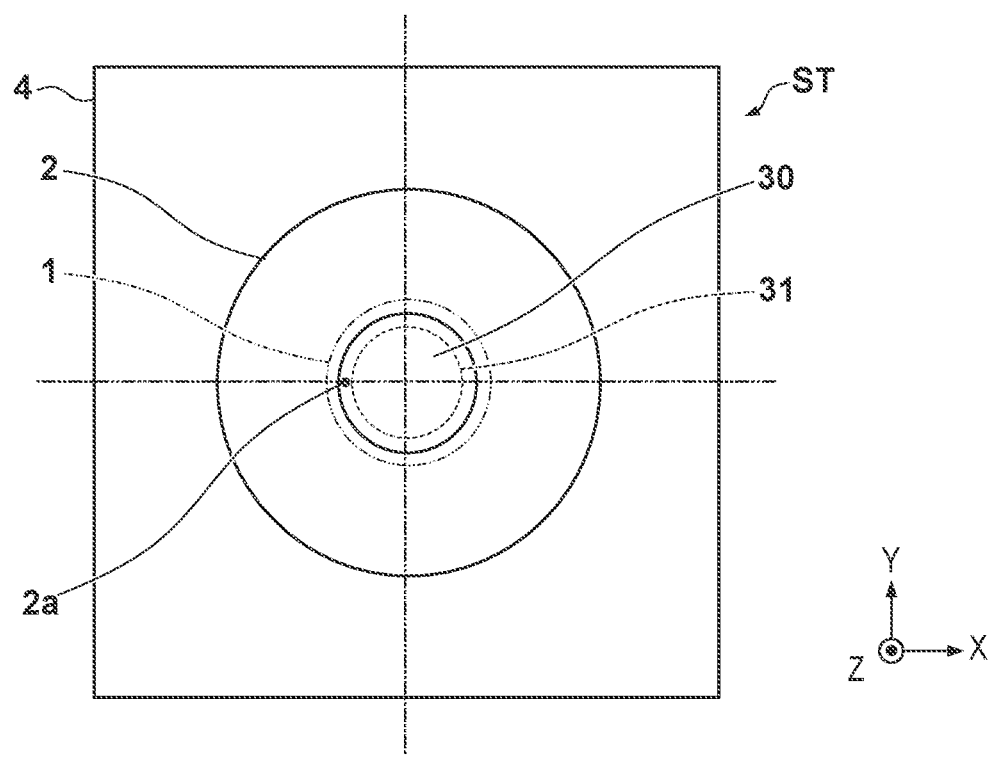

Next, holding of the substrate 1 by the substrate stage ST will be described with reference to FIGS. 3 to 4B. FIG. 3 is a schematic sectional view (a sectional view taken along a line A-A in FIG. 2) of the substrate stage ST holding the substrate 1 via the plate 2. FIG. 4A is a view (a top view taken along a line B-B in FIG. 3) showing the holding surface of the substrate stage ST (substrate chuck 3) when viewed from the +Z direction, and FIG. 4B is a view (a top view taken along a line C-C in FIG. 3) showing the plate 2 held by the substrate stage ST when viewed from the +Z direction.

A plurality holding regions where a holding force for holding the plate 2 can be individually adjusted are provided in the holding surface of the substrate stage ST (substrate chuck 3). In this embodiment, a first holding region 31 arranged at a position that overlaps the substrate 1 and used to hold the central portion of the plate 2, and a second holding region 32 arranged around the first holding region 31 and used to hold the outer peripheral portion of the plate 2 are provided in the holding surface of the substrate stage ST. Each of the first holding region 31 and the second holding region 32 is formed by a groove formed in the holding surface of the substrate stage ST. An outer peripheral bank portion 33 is provided in the outer periphery of the second holding region 32, and a central bank portion 34 is provided between the first holding region 31 and the second holding region 32. The groove forming the first holding region 31 communicates with a pressure regulator 39 (vacuum source) via a channel 36 formed in the substrate stage ST (the substrate chuck 3 and the movable member 4) so that the internal pressure (vacuum pressure) can be regulated by the pressure regulator 39. The groove forming the second holding region 32 communicates with a pressure regulator 40 (vacuum source) via a channel 37 formed in the substrate stage ST (the substrate chuck 3 and the movable member 4) so that the internal pressure (vacuum pressure) can be regulated by the pressure regulator 40. With the arrangement as described above, it is possible to individually adjust the holding force (vacuum pressure) generated in the first holding region 31 and the holding force (vacuum pressure) generated in the second holding region 32. Note that a plurality of support pins (not shown) for supporting the plate 2 are preferably provided in the grooves forming the first holding region 31 and the second holding region 32.

A support region 30 for supporting (holding) the substrate 1 is provided in the top surface (the surface on the opposite side of the surface held by the substrate stage ST) of the plate 2. In this embodiment, the support region 30 of the plate 2 is formed by a groove formed in the top surface of the plate 2, and communicates with a supply hole 35a provided in the holding surface of the substrate stage ST via a communication path 2a formed in the plate. The supply hole 35a is a hole for supplying a vacuum pressure to the plate 2, and communicates with a pressure regulator 38 (vacuum source) via a channel 35 formed in the substrate stage ST (the substrate chuck 3 and the movable member 4). With this arrangement, the groove forming the support region 30 of the plate 2 communicates with the pressure regulator 38 via the communication path 2a and the channel 35 so that the internal pressure (vacuum pressure) is regulated by the pressure regulator 38. That is, the plate 2 can hold the substrate 1 by the vacuum pressure supplied from the supply hole 35a to the support region 30 via the communication path 2. Further, since the supply hole 35a is provided in the central bank portion 34 between the first holding region 31 and the second holding region 32 in the substrate stage ST, the vacuum pressure of the support region 30 of the plate 2 can be regulated independently of those of the first holding region 31 and the second holding region 32. Note that a plurality of support pins (not shown) for supporting the plate 2 are preferably provided in the groove forming the support region 30 of the plate 2.

[Imprint Process]

Figure 5:
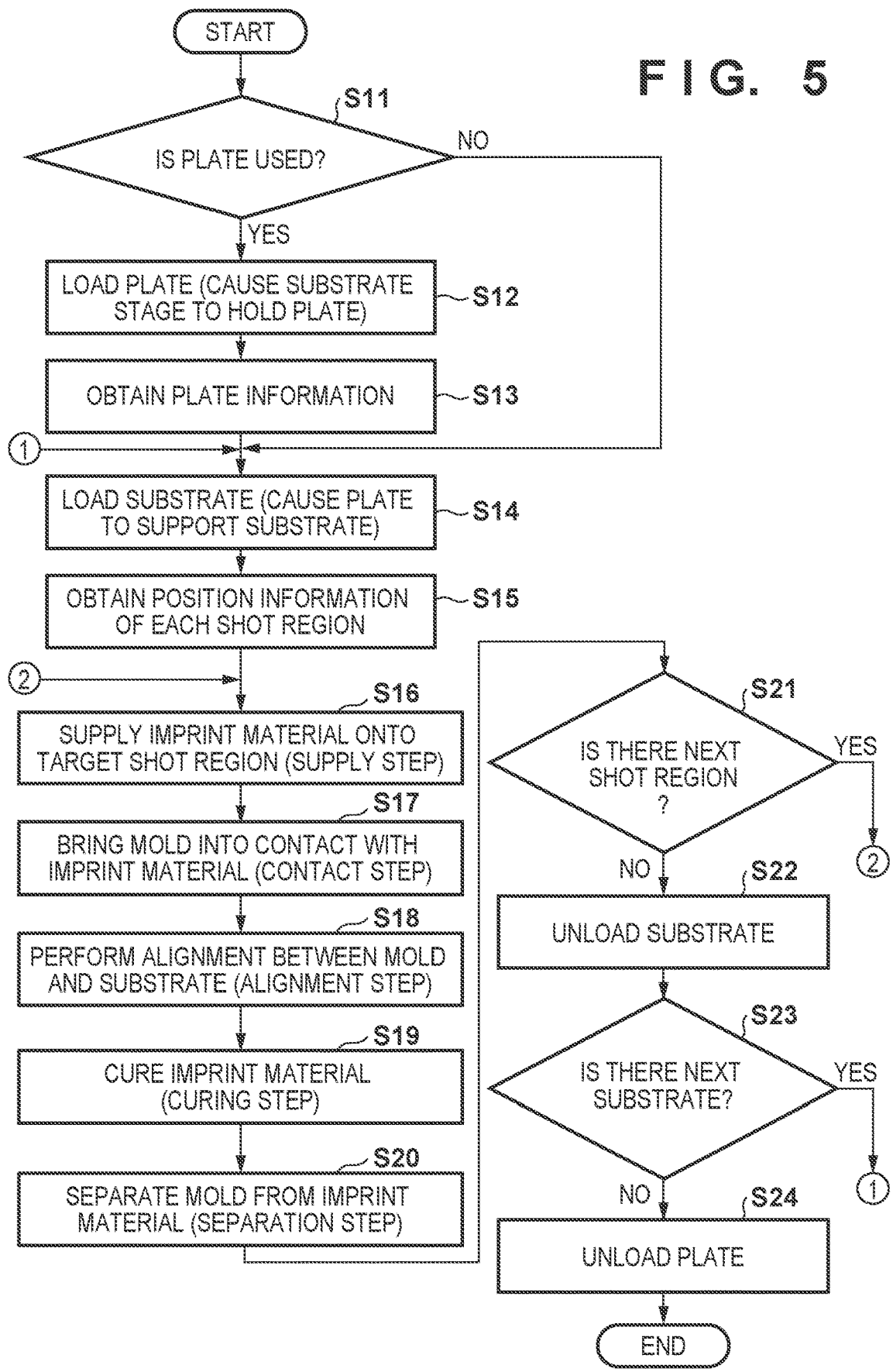
FIG. 5 is a flowchart illustrating an imprint process according to the first embodiment.

Next, an imprint process executed by the imprint apparatus 100 according to this embodiment will be described. FIG. 5 is a flowchart illustrating the imprint process according to this embodiment. Respective steps of the flowchart illustrated in FIG. 5 can be controlled by the controller 19.

In step S11, the controller 19 determines whether to use the plate 2. For example, the controller 19 obtains substrate information concerning the dimension and/or thickness of the substrate 1 as a target of the imprint process and, based on the substrate information, determines whether to use the plate 2. If the dimension of the substrate 1 indicated by the substrate information is smaller than the dimension of the holding surface of the substrate stage ST, the controller 19 determines to use the plate 2, and the process advances to step S12. On the other hand, if the dimension of the substrate 1 indicated by the substrate information is equal to the dimension of the holding surface of the substrate stage ST, the controller 19 determines not to use the plate 2, and the process advances to step S14. Note that the controller 19 may obtain the substrate information already stored in a storage unit (memory) of the imprint apparatus 100 from the storage unit, or may obtain the substrate information via a user interface of the imprint apparatus 100 or the like.

In step S12, the controller 19 controls a plate conveyance mechanism (not shown) to convey the plate 2 onto the holding surface of the substrate stage ST (substrate chuck 3), and causes the holding surface of the substrate stage ST to hold the plate 2. In this embodiment, the controller 19 causes the substrate stage ST to hold the plate 2 by the first holding region 31 and the second holding region 32 by controlling the pressure regulators 39 and 40. Here, if a plurality of kinds of the plates 2 are stored in the imprint apparatus 100, the controller 19 may select the plate 2 to be used from the plurality of kinds of the plates 2 in accordance with the dimension of the substrate 1 based on the substrate information obtained in step S11. In this case, the selected plate 2 is conveyed onto the holding surface of the substrate stage ST by the plate conveyance mechanism (not shown). Note that a substrate conveyance mechanism (not shown) that conveys the substrate 1 to the substrate stage ST may be used as the plate conveyance mechanism.

In step S13, the controller 19 obtains the plate information concerning the dimension and thickness (height) of the plate 2 to be used. The controller 19 may obtain the plate information already stored in the storage unit (memory) of the imprint apparatus 100 from the storage unit, or may obtain the plate information via the user interface of the imprint apparatus 100 or the like. In addition to the information concerning the dimension and thickness of the plate 2, the plate information may include information concerning the dimension of the support region 30 and/or the position of the communication path 2a.

In step S14, the controller 19 controls the substrate conveyance mechanism (not shown) to convey the substrate 1 to the substrate stage ST. In a case of using the plate 2, the controller 19 conveys the substrate 1 onto the support region 30 of the plate 2, and causes the holding surface of the substrate stage ST to hold the substrate 1 via the plate 2, thereby causing the plate 2 to support the substrate 1. In this embodiment, the controller 19 controls the pressure regulator 38, thereby causing the plate 2 to support the substrate 1 by the support region 30.

In step S15, the controller 19 causes the second measurement device 17 to measure the position of the mark (alignment mark) provided in each of the plurality of shot regions in the substrate 1 to obtain the position information of each shot region of the substrate 1 with respect to the substrate stage ST. The controller 19 may obtain the position information by causing the second measurement device 17 to measure the mark positions of all the shot regions in the substrate 1, or may obtain the position information by causing the second measurement device 17 to measure the mark positions of some sample shot regions. Based on each mark position measured by the second measurement device 17, the controller 19 may obtain information concerning the shape and posture (orientation) of each shot region.

In step S16, the controller 19 causes the supplier 18 to supply the imprint material onto a target shot region of the imprint process among the plurality of shot regions in the substrate 1 (supply step). For example, the controller 19 causes the substrate stage ST to move the substrate 1 such that the target shot region is arranged below the supplier 18, and then causes the supplier 18 to discharge the imprint material while relatively moving the supplier 18 and the substrate 1. With this processing, the imprint material can be supplied onto the target shot region.

In step S17, the controller 19 brings the pattern region 11 of the mold 10 into contact with the imprint material on the target shot region of the substrate 1 (contact step). For example, based on the position information of each shot region obtained in step S15, the controller 19 causes the substrate stage ST to move the substrate 1 such that the target shot region is arranged below the mold 10 (pattern region 11). Then, the controller 19 causes the imprint head IH (mold driving device 14) to drive the mold 10 in the −Z direction to decrease the gap (spacing) between the mold 10 and the substrate 1, thereby bringing the pattern region 11 of the mold 10 into contact with the imprint material on the target shot region. Here, control of the gap (spacing) between the mold 10 and the holding surface of the substrate stage ST in the contact step is set assuming a case of using no plate 2. Therefore, in a case of the plate 2, it is necessary to offset the control of the gap between the mold 10 and the holding surface of the substrate stage ST in accordance with the thickness of the plate 2. Hence, in the case of using the plate 2, the controller 19 may control the gap between the mold 10 and the holding surface of the substrate stage ST in the contact step, such that the gap is offset by the thickness of the plate 2 based on the plate information obtained in step S13.

In step S18, the controller 19 performs alignment between the pattern region 11 of the mold 10 and the target shot region of the substrate 1 (alignment step). For example, the controller 19 causes the first measurement device 16 to measure the relative position between the alignment mark provided in the mold 10 and an alignment mark provided in the target shot region of the substrate 1. Then, the controller 19 performs alignment between the pattern region 11 of the mold 10 and the target shot region of the substrate 1 such that the relative position measured by the first measurement device 16 matches a target relative position.

In step S19, the controller 19 causes the irradiator 15 to irradiate the imprint material with curing light (for example, ultraviolet light) to cure the imprint material (curing step). The curing step is performed in a state in which the pattern region 11 of the mold 10 and the imprint material on the target shot region of the substrate 1 are in contact with each other.

In step S20, the controller 19 causes the imprint head IH (mold driving device 14) to drive the mold 10 in the +Z direction to increase the gap between the mold 10 and the substrate 1 and separate the mold 10 from the cured imprint material (separation step). With this processing, the pattern with convex and concave portions formed in the pattern region 11 of the mold 10 is transferred to the imprint material on the target shot region of the substrate 1, so that a pattern of the imprint material can be formed on the target shot region. Here, as in the contact step (S17), control of the gap between the mold 10 and the holding surface of the substrate stage ST in the separation step is set assuming a case of using no plate 2. Therefore, in a case of using the plate 2, it is necessary to offset the control of the gap between the mold 10 and the holding surface of the substrate stage ST in accordance with the thickness of the plate 2. Hence, in the case of using the plate 2, the controller 19 may control the gap between the mold 10 and the holding surface of the substrate stage ST in the separation step, such that the gap is offset by the thickness of the plate 2 based on the plate information obtained in step S13.

In step S21, the controller 19 determines whether there is a shot region (next shot region) to undergo the imprint process next in the substrate 1. If there is a next shot region, the process advances to step S16. If there is no next shot region, the process advances to step S22. In step S22, the controller 19 uses the substrate conveyance mechanism (not shown) to unload the substrate 1 from the substrate stage ST.

In step S23, the controller 19 determines whether there is the substrate 1 (next substrate) of the same dimension to undergo the imprint process next. If there is the next substrate, the process returns to step S14. If there is no next substrate 1, the process advances to step S24. In step S24, the controller 19 uses the plate conveyance mechanism (not shown) to unload the plate 2 from the substrate stage ST.

Here, in the separation step (S20), a distortion or a defect may be generated in the pattern of the imprint material formed on the substrate 1. In order to reduce such a distortion and a defect, it is preferable to locally deform the substrate 1 into a convex shape in the separation step as described in patent literature 1. On the other hand, if the substrate 1 having a dimension smaller than the dimension of the holding surface of the substrate stage ST is deformed into a convex shape in the separation step, the holding force for holding the substrate 1 by the holding surface of the substrate stage ST can become insufficient with respect to the mold separation force for separating the mold 10. As a result, the substrate 1 may come off the substrate stage ST along with the separation of the mold 10.

To prevent this, in this embodiment, holding of the plate 2 by the substrate stage ST is controlled while maintaining supporting of the substrate 1 by the plate 2 such that the substrate 1 is deformed into a convex shape together with the plate 2 upon separating the mold 10 from the imprint material on the substrate 1 in the separation step. That is, it may be understood that, in the separation step, the substrate 1 is locally deformed into a convex shape together with the plate 2 in a state in which the substrate 1 and the plate 2 are integrated with each other. More specifically, among the plurality of holding regions in the substrate stage ST, the holding force of the holding region (for example, the first holding region 31) corresponding to the portion of the substrate 1 in contact with the mold 10 via the imprint material is made smaller than the holding force of the other holding region (for example, the second holding region 32). With this, a distortion and a defect that can be generated in the pattern of the cured imprint material can be reduced, and it can be avoided that the substrate 1 comes off the substrate stage ST in the separation step.

Figure 6A:
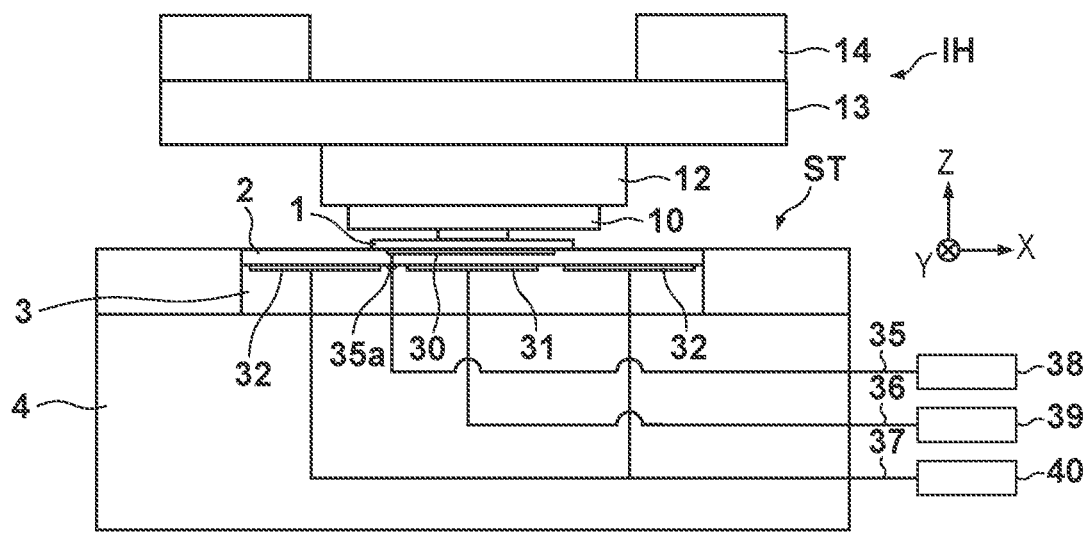
FIGS. 6A and 6B are views showing an operation of the imprint apparatus in a separation step according to the first embodiment.
Figure 6B:
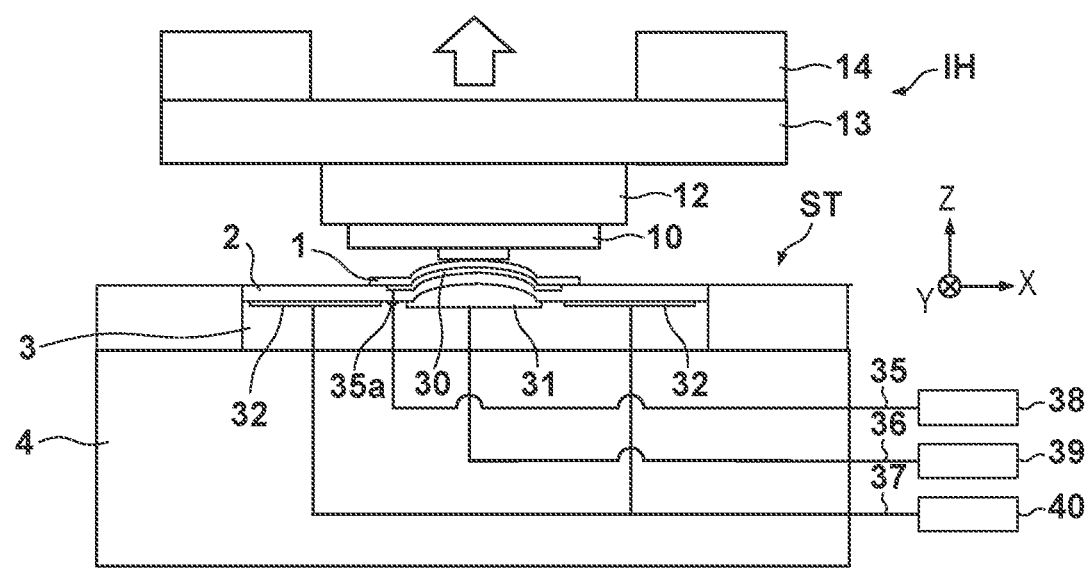

FIGS. 6A and 6B are views showing an operation of the imprint apparatus 100 in the separation step, and showing the imprint head IH, the mold 10, the substrate stage ST, the substrate 1, and the plate 2. FIG. 6A shows a state immediately before the separation step is started (that is, immediately before a mold separation force is generated in the imprint head IH), and FIG. 6B shows a state halfway through the separation step.

Immediately before the separation step shown in FIG. 6A, the controller 19 controls the pressure regulators 39 and 40 so as to make the holding force of the first holding region 31 of the substrate stage ST smaller than the holding force of the second holding region 32. That is, it may be understood that, while maintaining the holding force of the second holding region 32 at a predetermined holding force, the holding force of the first holding region 31 is made smaller than the predetermined holding force. The predetermined holding force is a holding force (target holding force) set so as to be capable of sufficiently holding the substrate 1 or the plate 2, and can be the holding force used in the preceding steps (for example, the contact step and the curing step).

For example, assume a case in which, in the contact step and the curing step, a vacuum pressure $V_0 = -70$ kPa is supplied to both the first holding region 31 and the second holding region 32 as the predetermined holding force. In this case, in the separation step, while maintaining the holding force of the second holding region 32 at the vacuum pressure $V_0 = -70$ kPa, the holding force of the first holding region 31 is changed to a vacuum pressure $V_1 = -10$ kPa. Here, the holding force of the support region 30 of the plate 2 is controlled by the pressure regulator 38 so as to be capable of sufficiently supporting the substrate 1, and maintained also in the separation step. That is, through the contact step, the curing step, and the separation step, the holding force of the support region 30 of the plate 2 is maintained at the vacuum pressure $V_0 = -70$ kPa.

Then, as shown in FIG. 6B, the controller 19 controls the mold driving device 14 so as to increase the gap between the mold 10 and the holding surface of the substrate stage ST, thereby applying a force (mold separation force) in the +Z direction to the imprint head IH. At this time, as has been described above, the holding force of the first holding region 31 of the substrate stage ST is controlled to become smaller than the predetermined holding force and the holding force of the second holding region 32. The holding force of the second holding region 32 of the substrate stage ST and the holding force of the support region 30 of the plate 2 are controlled to be maintained at the predetermined holding force. Accordingly, when a part of the substrate 1 in contact with the mold 10 via the imprint material is lifted up by the mold separation force of the imprint head IH, the substrate 1 can be locally deformed into a convex shape together with the plate 2. That is, the substrate 1 and the plate 2 can be integrally deformed into the convex shape.

With the control in the separation step as described above, it is possible to gradually release the imprint material on the substrate from the peripheral portion of the pattern region 11 of the mold 10 toward the central portion. Thus, a distortion and a defect in the pattern of the imprint material formed on the substrate after the separation step can be reduced. Since the substrate 1 is sufficiently held by the plate 2 by the support region 30, and the plate 2 is sufficiently held by the substrate stage ST by the second holding region 32, the substrate 1 and the plate 2 coming off the substrate stage ST can be avoided.

Further, in this embodiment, the supply hole 35a for supplying the vacuum pressure to the plate 2 is provided in the central bank portion 34 between the first holding region 31 and the second holding region 32 in the substrate stage ST. Although the plate 2 is deformed into the convex shape in the first holding region 31, the plate 2 is sufficiently held in the second holding region 32. Thus, it is possible to reduce lift-up (separation) of the plate 2 from the central bank portion 34. That is, the vacuum pressure supplied to the plate 2 via the supply hole 35a can be prevented from leaking between the central bank portion 34 and the plate 2, so that supporting of the substrate 1 by the plate 2 can be maintained also in the separation step.

Here, in the above example, the vacuum pressure $V_0$ is set at −70 kPa, and the vacuum pressure $V_1$ is set at −10 kPa, but the present invention is not limited to this. The vacuum pressure $V_1$ is only required to be a pressure higher than the vacuum pressure $V_0$. That is, the holding force defined by the vacuum pressure $V_1$ is only required to be smaller than the holding force defined by the vacuum pressure $V_0$. The vacuum pressure $V_1$ is only required to be a pressure capable of deforming the substrate 1 into the convex shape together with the plate 2 in the separation step, and may be a positive pressure. The vacuum pressure $V_0$ is only required to be a pressure with which the support region 30 of the plate 2 can sufficiently support the substrate 1 and the second holding region 32 of the substrate stage ST can sufficiently hold the plate 2.

In the above example, the substrate 1 and the plate 2 are individually conveyed (loaded and unloaded) to/from the substrate stage ST, but the present invention is not limited to this. The substrate 1 arranged on the plate 2 may be conveyed to/from the substrate stage ST. With this, the time required for conveyance of the substrate 1 and the plate 2 can be shortened, and this can be advantageous in terms of throughput.

Second Embodiment

The second embodiment according to the present invention will be described. The second embodiment is different from the first embodiment in the arrangement of a substrate stage ST (substrate chuck 3) and a plate 2, but the remaining arrangement of an imprint apparatus 100 is similar to that described in the first embodiment. An operation (for example, an imprint process) performed in the imprint apparatus 100 is also similar to that described in the first embodiment.

Figure 7A:
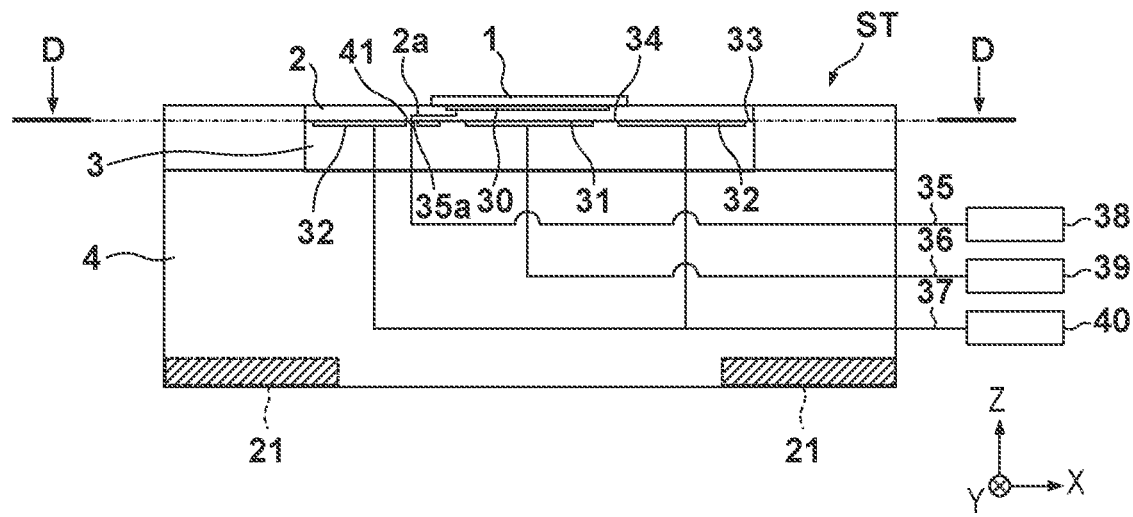
FIGS. 7A and 7B are schematic views showing a substrate stage according to the second embodiment.
Figure 7B:
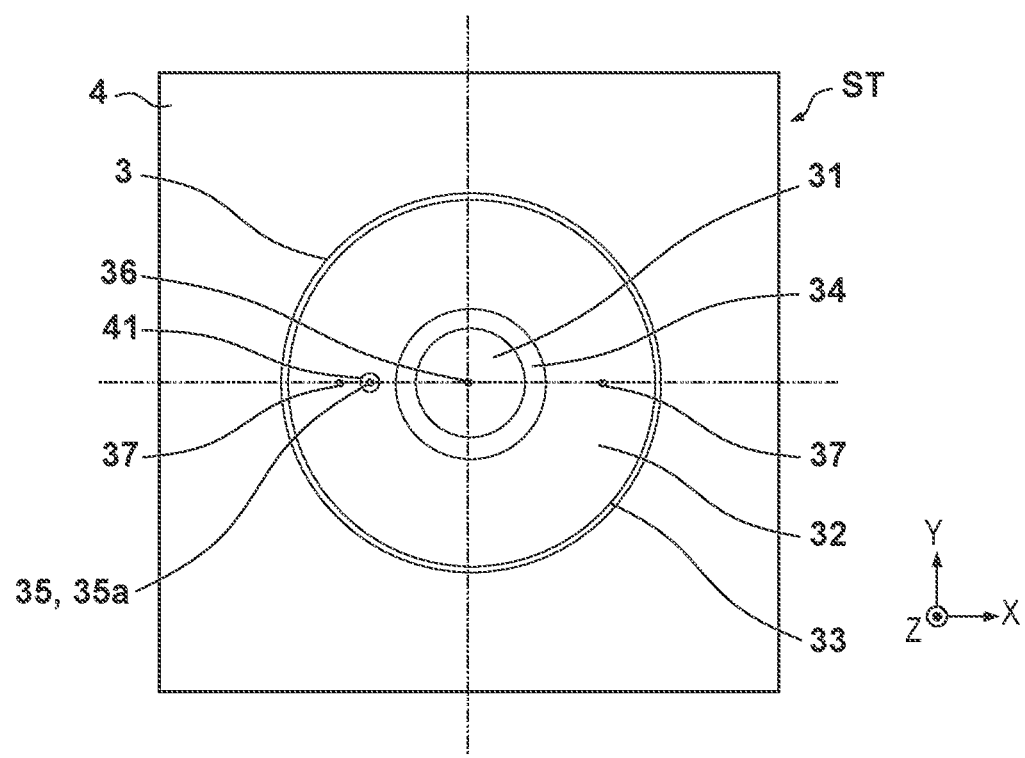

FIG. 7A is a schematic sectional view of the substrate stage ST holding a substrate 1 via the plate 2, and FIG. 7B is a view (a top view taken along a line D-D in FIG. 7A) showing the holding surface of the substrate stage ST (substrate chuck 3) when viewed from the +Z direction. In the first embodiment, the supply hole 35a for supplying the vacuum pressure to the plate 2 is provided in the central bank portion 34. However, in this embodiment, as shown in FIGS. 7A and 7B, a supply hole 35a is provided in a partial bank portion 41. The partial bank portion 41 is arranged at a position surrounded by one holding region of a plurality of holding regions. In this embodiment, the partial bank portion 41 is arranged at a position surrounded by a second holding region 32. When the supply hole 35a is provided in the partial bank portion 41 arranged as described above, the plate 2 is sufficiently held in the second holding region 32 around the partial bank portion 41. Thus, it is possible to reduce lift-up (separation) of the plate 2 from the partial bank portion 41. That is, the vacuum pressure supplied to the plate via the supply hole 35a can be prevented from leaking between the partial bank portion 41 and the plate 2, so that supporting of the substrate 1 by the plate 2 can be maintained also in the separation step.

Third Embodiment

The third embodiment according to the present invention will be described. The third embodiment is different from the first embodiment in the arrangement of a substrate stage ST (substrate chuck 3) and a plate 2, but the remaining arrangement of an imprint apparatus 100 is similar to that described in the first embodiment. An operation (for example, an imprint process) performed in the imprint apparatus 100 is also similar to that described in the first embodiment.

Figure 8:
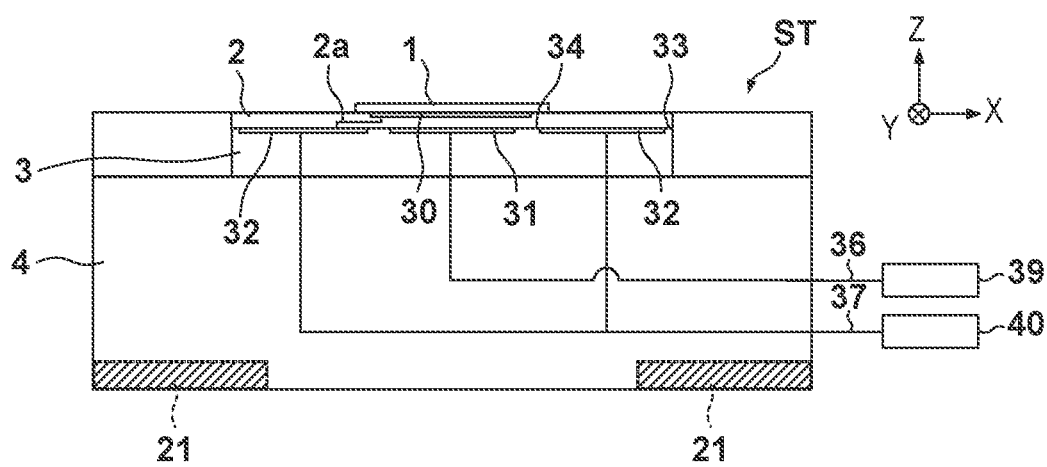
FIG. 8 is a schematic view showing a substrate stage according to the third embodiment.

FIG. 8 is a schematic sectional view of the substrate stage ST holding a substrate 1 via the plate 2. In this embodiment, a supply hole 35a for supplying a vacuum pressure to the plate 2 is not provided in the substrate stage ST (substrate chuck 3), and a communication path 2a of the plate 2 is configured to communicate a support region 30 of the plate 2 and a second holding region 32 of the substrate stage ST. That is, in the substrate stage ST according to this embodiment, the vacuum pressure of the support region 30 of the plate 2 can be regulated by regulating the vacuum pressure of the second holding region 32 by a pressure regulator 40.

In a case of using such the plate 2, for example, in step S12 in the flowchart of FIG. 5 described above, the plate 2 is merely conveyed onto the holding surface of the substrate stage ST, and the holding surface of the substrate stage ST does not hold holding the plate 2. Then, when the substrate 1 is conveyed onto the support region 30 of the plate 2 in step S14, the vacuum pressure is supplied to the second holding region 32 of the substrate stage ST by the pressure regulator 40. Along with this, the vacuum pressure is also supplied to the support region 30 of the plate 2 via the communication path 2a.

Further, in the separation step (S20), by the pressure regulator 40 controlling the vacuum pressure of the second holding region 32 alone, a holding force (vacuum pressure) similar to that of the second holding region 32 can be generated in the support region 30 of the substrate stage ST. For example, when deforming the substrate 1 into the convex shape together with the plate 2 in the separation step, as has been described above, the holding force of the first holding region 31 of the substrate stage ST is changed to a vacuum pressure $V_1$ while maintaining the holding force of the second holding region 32 of the substrate stage ST at a vacuum pressure $V_0$. In this case, the holding force of the support region 30 of the plate 2 is also maintained at the vacuum pressure $V_0$ in accordance with the holding force of the second holding region 32 without individually controlling the holding force of the support region 30 of the plate 2.

Fourth Embodiment

The fourth embodiment according to the present invention will be described. The fourth embodiment is different from the first embodiment in the arrangement of a substrate stage ST (substrate chuck 3) and a plate 2, but the remaining arrangement of an imprint apparatus 100 is similar to that described in the first embodiment. An operation (for example, an imprint process) performed in the imprint apparatus 100 is also similar to that described in the first embodiment.

Figure 9A:
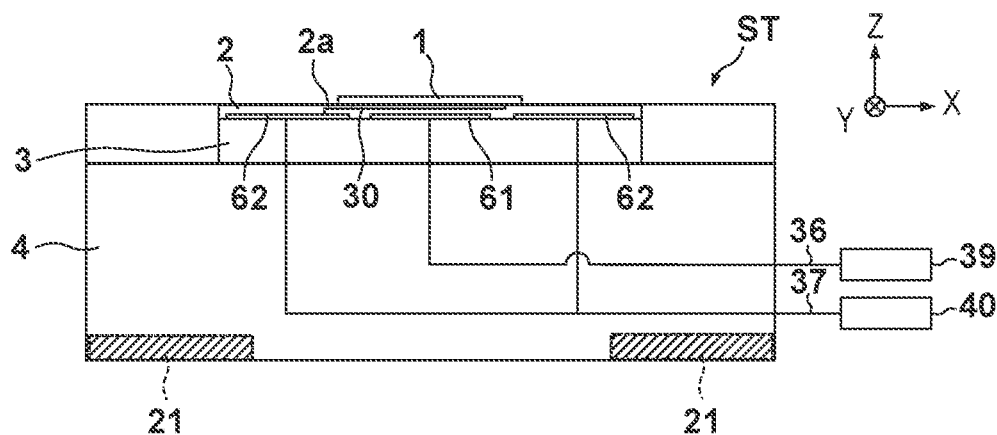
FIGS. 9A and 9B are schematic views showing a substrate stage according to the fourth embodiment.

FIG. 9A is a schematic sectional view of the substrate stage ST holding a substrate 1 via the plate 2. In this embodiment, no groove is formed in a first holding region 31 and a second holding region 32 of the substrate stage ST, but a groove is formed in each of a region 61 corresponding to the first holding region 31 and a region 62 corresponding to the second holding region 32 in the lower surface of the plate 2. The lower surface of the plate 2 is the surface held by the substrate stage ST. The region 61 is arranged at a position that overlaps the substrate 1 and a support region 30 of the plate 2, and the internal pressure is controlled by a pressure regulator 39 via a channel 36 formed in the substrate stage ST. The region 62 is arranged around the region 61, and the internal pressure is controlled by a pressure regulator 40 via a channel 37 formed in the substrate stage ST. In addition, in this embodiment, no supply hole 35a for supplying a vacuum pressure to the plate 2 is provided in the substrate stage ST, and a communication path 2a of the plate 2 is configured to communicate the support region 30 of the plate 2 and the second holding region 32 of the substrate stage ST. Also with the arrangement as described above, the substrate 1 can be deformed into a convex shape together with the plate 2 in the separation step by the control as in the first embodiment.

Figure 9B:
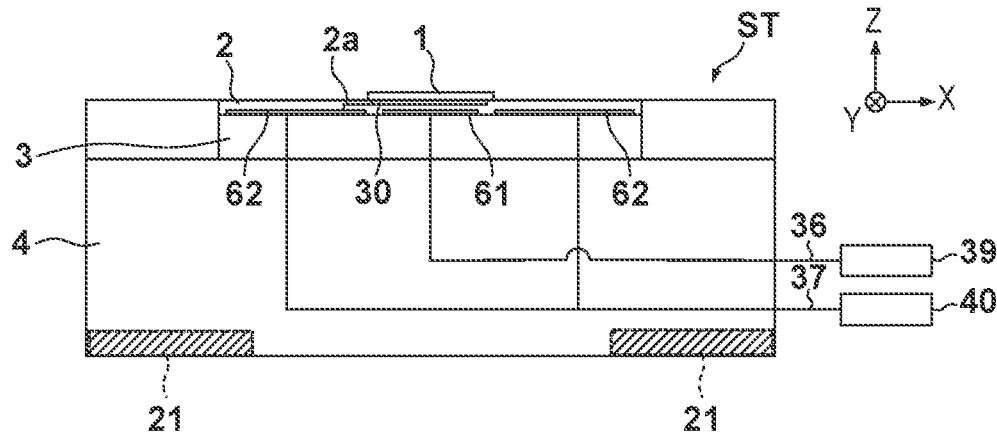

Further, in this embodiment, even if the dimension of the substrate 1 is changed, it is only required to change the arrangement (dimensions of the regions 61 and 62) of the plate 2 without changing the arrangement (that is, dimensions of the first holding region 31 and the second holding region 32) of the substrate chuck 3 of the substrate stage ST. For example, FIG. 9B shows a case in which the imprint process is performed on the substrate 1 smaller than in the example shown in FIG. 9A. As shown in FIGS. 9A and 9B, when performing the imprint process on a plurality of kinds of the substrates 1 having different dimensions, it is only required to prepare a plurality of kinds of the plates 2 having different dimensions of the regions 61 and 62, and change the plate 2 in accordance with the kind of the substrate 1. That is, since it is unnecessary to change the arrangement (positions of the channels 36 and 37) of the substrate stage ST, the degree of freedom of the dimension of the substrate 1 on which the imprint process can be performed increases, and this can also be advantageous in terms of manufacturing cost.

Here, the plurality of kinds of the plates 2 may be stored in a storage (stocker) in the imprint apparatus 100. In this case, in step S12 described above, the plate 2 corresponding to the dimension of the substrate 1 can be selected from the plurality of kinds of the plates 2, and the selected plate 2 can be conveyed to the substrate stage ST. Further, in this embodiment, the communication path 2a of the plate 2 is configured to communicate the support region 30 of the plate 2 and the second holding region 32 of the substrate stage ST, but the present invention is not limited to this. For example, as has been described in the first embodiment, the communication path 2a of the plate 2 may be configured to communicate the supply hole 35a provided in the holding surface of the substrate stage ST and the support region 30.

Fifth Embodiment

The fifth embodiment according to the present invention will be described. The fifth embodiment is different from the first embodiment in the arrangement of a substrate stage ST (substrate chuck 3), but the remaining arrangement of an imprint apparatus 100 is similar to that described in the first embodiment. An operation (for example, an imprint process) performed in the imprint apparatus 100 is also similar to that described in the first embodiment. Note that the substrate stage ST and a plate 2 are not limited to those described in the first embodiment, and those described in each of the second to fourth embodiments may be applied.

Figure 10A:
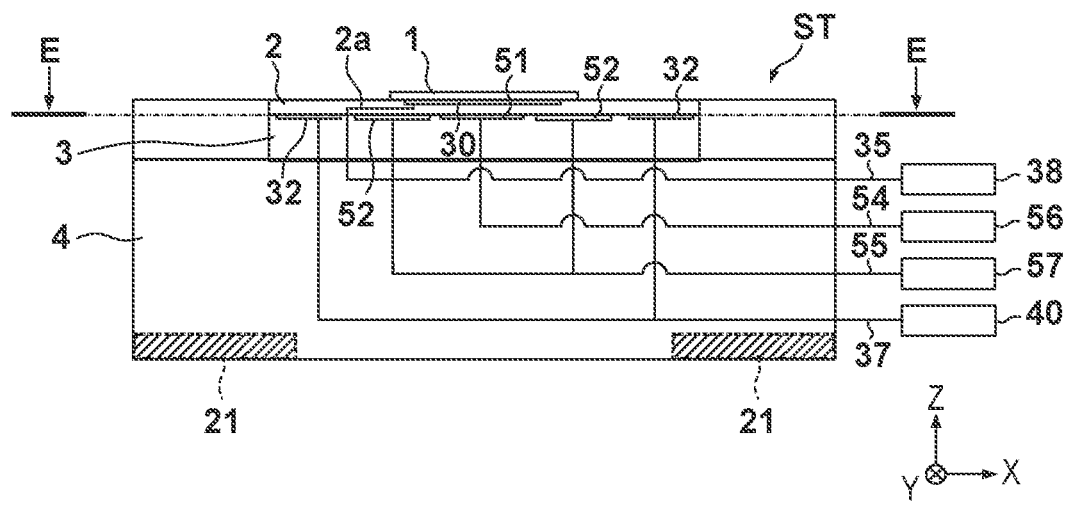
FIGS. 10A and 10B are schematic views showing a substrate stage according to the fifth embodiment.
Figure 10B:
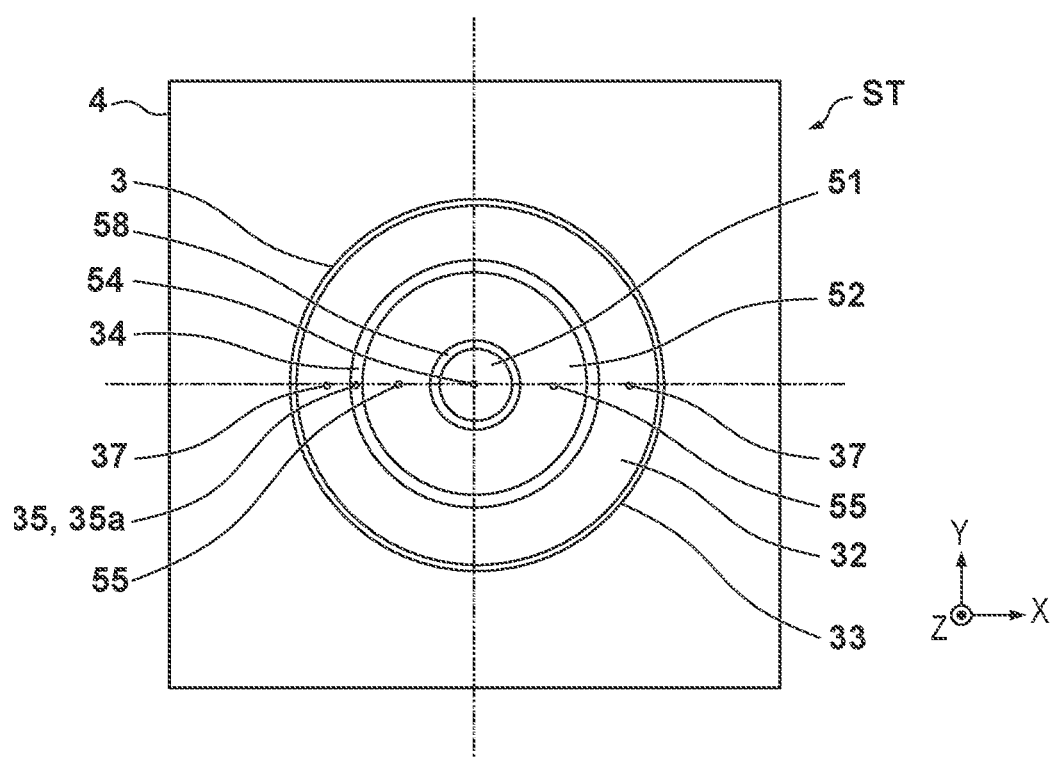

FIG. 10A is a schematic sectional view of the substrate stage ST holding a substrate 1 via the plate 2, and FIG. 10B is a view (a top view taken along a line E-E in FIG. 10A) showing the holding surface of the substrate stage ST (substrate chuck 3) when viewed from the +Z direction. In the substrate stage ST according to this embodiment, a first holding region 31 is divided into a plurality of partial holding regions. In the example shown in FIGS. 10A and 10B, the first holding region 31 can include a partial holding region 51 arranged at a position corresponding to the central portion of the substrate 1 and a partial holding region 52 arranged at a position corresponding to the outer peripheral portion of the substrate 1 in a planar view. The partial holding region 52 is arranged around the partial holding region 51. Each of the partial holding regions 51 and 52 is formed by a groove formed in the holding surface of the substrate stage ST, and a bank portion 58 separates them from each other. The groove forming the partial holding region 51 communicates with a pressure regulator 56 (vacuum source) via a channel 54 formed in the substrate stage ST so that the internal pressure (vacuum pressure) can be regulated by the pressure regulator 56. The groove forming the partial holding region 52 communicates with a pressure regulator 57 (vacuum source) via a channel 55 formed in the substrate stage ST so that the internal pressure (vacuum pressure) can be regulated by the pressure regulator 57. With the arrangement as described above, the holding force can be individually adjusted for each of a plurality of the partial holding regions 51 and 52 in the first holding region 31. Note that a plurality of support pins (not shown) for supporting the plate 2 may be provided in the grooves forming the partial holding regions 51 and 52.

Note that a second holding region 32 of the substrate stage ST and a support region 30 of the plate 2 are similar to those described in the first embodiment. More specifically, the groove forming the second holding region 32 communicates with a pressure regulator 40 (vacuum source) via a channel 37 formed in the substrate stage ST so that the internal pressure (vacuum pressure) can be regulated by the pressure regulator 40. The support region 30 of the plate 2 communicates with a supply hole 35a (not shown in FIG. 10A) provided in a central bank portion 34 of the holding surface of the substrate stage ST via a communication path 2a of the plate 2. The groove forming the support region 30 of the plate 2 communicates with a pressure regulator 38 via the communication path 2a and a channel 35 so that the internal pressure (vacuum pressure) can be regulated by the pressure regulator 38.

Figure 11A:
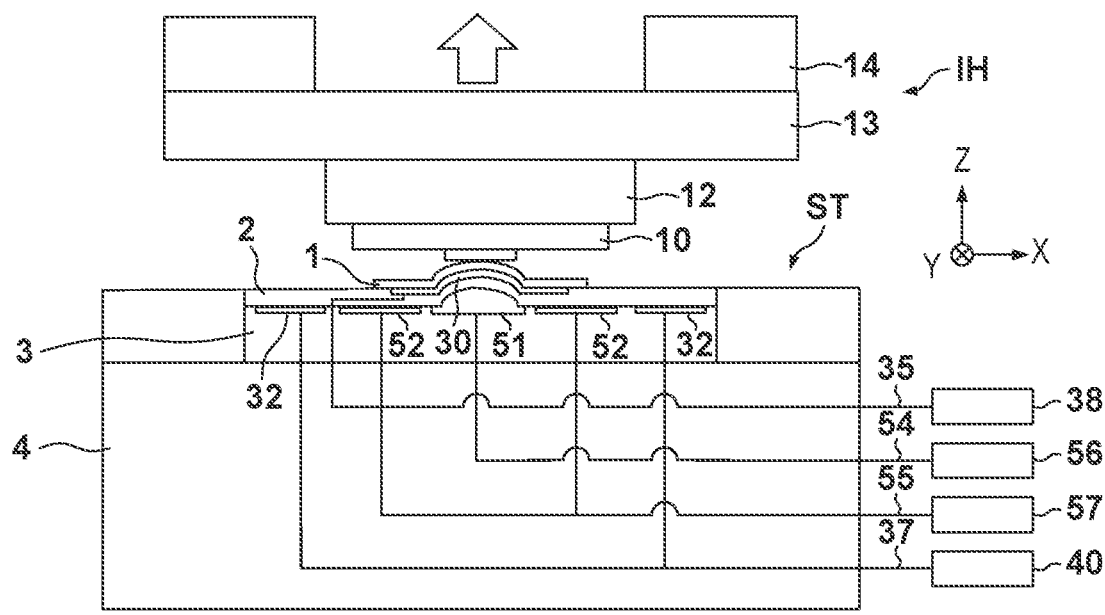
FIGS. 11A and 11B are views showing an operation of an imprint apparatus in a separation step according to the fifth embodiment.
Figure 11B:
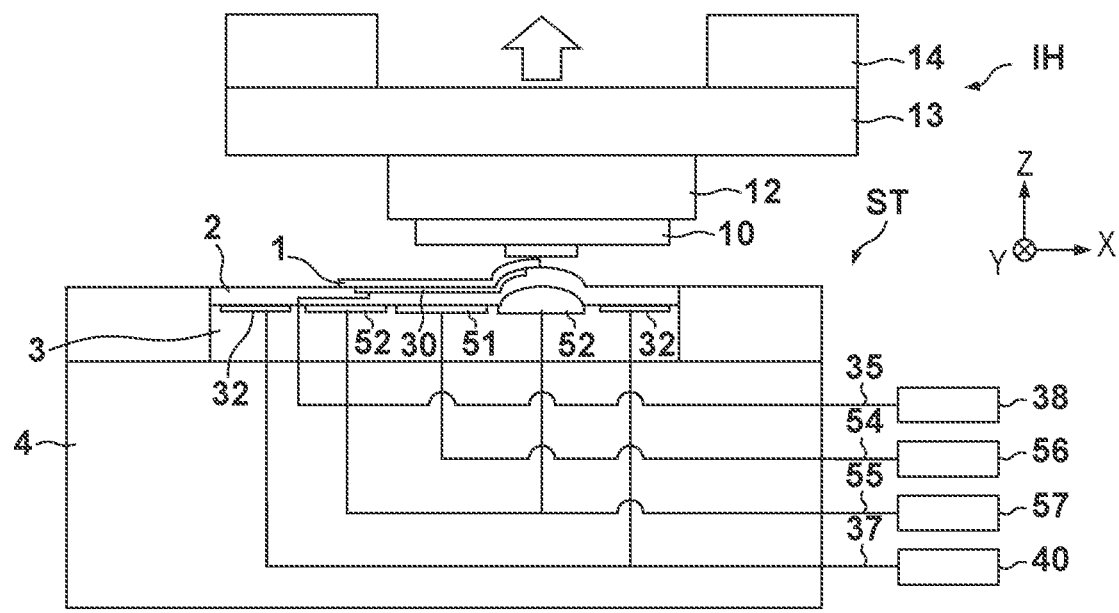

FIGS. 11A and 11B are views showing an operation of the imprint apparatus 100 in the separation step, and showing an imprint head IH, a mold 10, the substrate stage ST, the substrate 1, and the plate 2. FIG. 11A shows a state in which the separation step is in progress with respect to the shot region located in the central portion of the substrate 1, and FIG. 11B shows a state in which the separation step is in progress with respect to the shot region located in the outer peripheral portion of the substrate 1.

When performing the separation process with respect to the shot region located in the central portion of the substrate 1, as shown in FIG. 11A, the pressure regulator 56 is controlled so as to make the holding force of the partial holding region 51 of the substrate stage ST smaller than the holding forces of the other regions (the partial holding region 52 and the second holding region 32). More specifically, the holding force of the partial holding region 51 is changed to a vacuum pressure $V_1$ while maintaining the holding force of each of the partial holding region 52 and the second holding region 32 at a vacuum pressure $V_0$. At this time, the holding force of the support region 30 of the plate 2 is controlled by the pressure regulator 38 so as to be capable of sufficiently supporting the substrate 1. More specifically, the holding force of the support region 30 of the plate 2 is maintained at the vacuum pressure $V_0$. With this operation, in the mold separation process with respect to the central portion of the substrate 1, the central portion of the substrate 1 can be locally deformed into a convex shape together with the plate 2 by the mold separation force of the imprint head IH. As a result, a distortion and a defect in the pattern of the imprint material formed in the central portion of the substrate 1 after the separation step can be reduced.

When performing the separation process with respect to the shot region located in the outer peripheral portion of the substrate 1, as shown in FIG. 11B, the pressure regulator 57 is controlled so as to make the holding force of the partial holding region 52 of the substrate stage ST smaller than the holding forces of the other regions (the partial holding region 51 and the second holding region 32). More specifically, the holding force of the partial holding region 52 is changed to the vacuum pressure $V_1$ while maintaining the holding force of each of the partial holding region 51 and the second holding region 32 at the vacuum pressure $V_0$. At this time, the holding force of the support region 30 of the plate 2 is controlled by the pressure regulator 38 so as to be capable of sufficiently supporting the substrate 1. More specifically, the holding force of the support region 30 of the plate 2 is maintained at the vacuum pressure $V_0$. With this operation, in the mold separation process with respect to the outer peripheral portion of the substrate 1, the outer peripheral portion of the substrate 1 can be locally deformed into a convex shape together with the plate 2 by the mold separation force of the imprint head IH. As a result, a distortion and a defect in the pattern of the imprint material formed in the outer peripheral portion of the substrate 1 after the separation step can be reduced.

<Embodiment of Method of Manufacturing Article>

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern to an imprint material supplied (applied) onto a substrate by using the above-described imprint apparatus (imprint method), and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured material formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured material is directly used as the constituent member of at least some of the above-described articles or used temporarily as a resist mask. After etching or ion implantation is performed in the substrate processing step, the resist mask is removed.

Figure 12A:
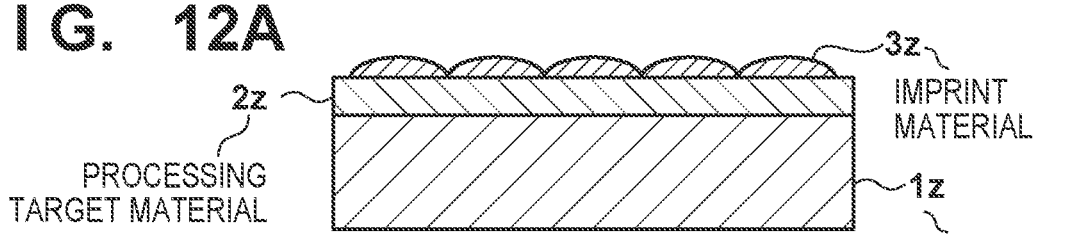
FIGS. 12A to 12F are views showing a method of manufacturing an article.

A detailed method of manufacturing an article will be described next. As shown in FIG. 12A, a substrate $1z$ such as a silicon wafer with a target material $2z$ to be processed such as an insulator formed on the surface is prepared. Next, an imprint material $3z$ is applied to the surface of the target material $2z$ by an inkjet method or the like. A state in which the imprint material $3z$ is applied as a plurality of droplets onto the substrate is shown here.

Figure 12B:
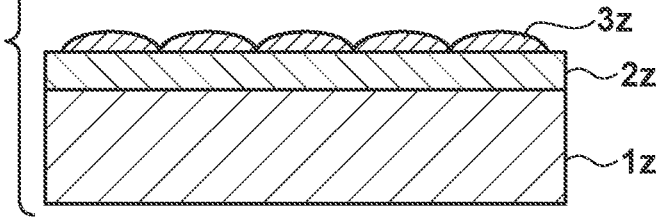
Figure 12C:
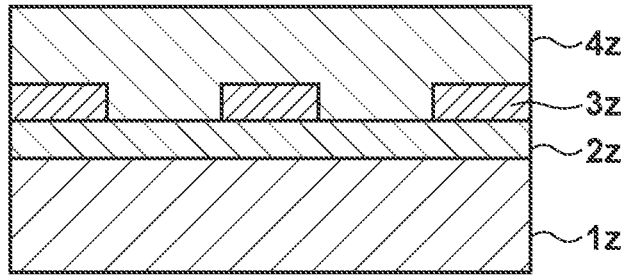

As shown in FIG. 12B, a mold $4z$ for imprint is caused to face to the substrate $1z$ such that a pattern with convex and concave portions formed in the mold $4z$ is directed to the imprint material $3z$ on the substrate $1z$. As shown in FIG. 12C, the mold $4z$ and the imprint material $3z$ applied on the substrate $1z$ are brought into contact with each other, and subjected to a pressure. The gap between the mold $4z$ and the target material $2z$ is filled with the imprint material $3z$. In this state, by irradiating the imprint material $3z$ with energy for curing through the mold $4z$, the imprint material $3z$ is cured.

Figure 12D:
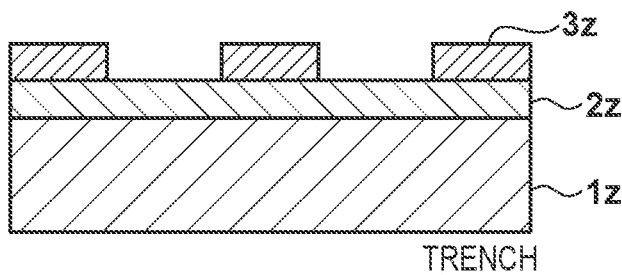

As shown in FIG. 12D, after the imprint material $3z$ is cured, the mold $4z$ is separated from the substrate $1z$. Then, the pattern of the cured material of the imprint material $3z$ is formed on the substrate $1z$. In the pattern of the cured material, the concave portion of the mold corresponds to the convex portion of the cured material, and the convex portion of the mold corresponds to the concave portion of the cured material. That is, the pattern with convex and concave portions in the mold $4z$ is transferred to the imprint material $3z$.

Figure 12E:
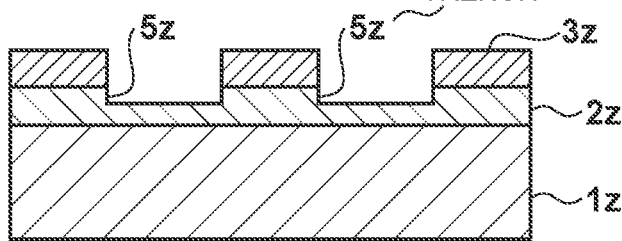
Figure 12F:
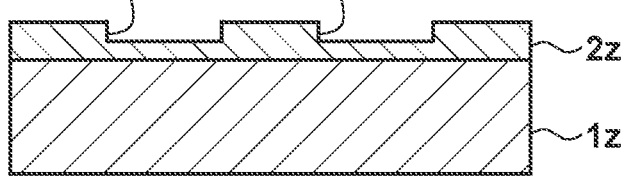

As shown in FIG. 12E, by performing etching process using the pattern of the cured material as an etching resistant mask, a portion of the surface of the target material $2z$ where the cured material does not exist or remains thin is removed to form a groove $5z$. As shown in FIG. 12F, by removing the pattern of the cured material, an article with the grooves $5z$ formed in the surface of the target material $2z$ can be obtained. Here, the pattern of the cured material is removed. However, instead of processing or removing the pattern of the cured material, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-158395 filed on Sep. 28, 2021, which is hereby incorporated by reference herein in its entirety.

What is claimed is:

1. An imprint method of forming, using a mold, a pattern of an imprint material on a substrate having a dimension smaller than a dimension of a holding surface of a substrate stage, the method comprising:
   causing the holding surface of the substrate stage to hold a plate having a dimension larger than the dimension of the substrate;
   causing the plate to support the substrate, by causing the holding surface of the substrate stage to hold the substrate via the plate;
   bringing the mold into contact with the imprint material supplied onto the substrate;
   curing the imprint material on the substrate; and
   separating the mold from the cured imprint material,
   wherein holding of the plate by the substrate stage is controlled while maintaining supporting of the substrate by the plate, such that the substrate is deformed into a convex shape together with the plate upon in the separating of the mold from the cured imprint material on the substrate.

2. The method according to claim 1, wherein
   the holding surface of the substrate stage includes a plurality of holding regions where a holding force of the plate can be individually adjusted, and
   in the separating of the mold from the cured imprint material on the substrate, the holding force of the holding region, of the plurality of holding regions, corresponding to a portion of the substrate in contact with the mold via the imprint material is made smaller than the holding force of the other holding region.

3. The method according to claim 1, wherein
   the holding surface of the substrate stage includes a first holding region arranged at a position that overlaps the substrate, and a second holding region arranged around the first holding region, and
   in the separating of the mold from the cured imprint material on the substrate, a holding force of the first holding region is made smaller than a holding force of the second holding region.

4. The method according to claim 3, wherein
   the plate includes a support region configured to support the substrate, and a communication path with which the support region and the second holding region communicate, and
   the plate supports the substrate by a vacuum pressure supplied from the second holding region to the support region via the communication path.

5. The method according to claim 1, wherein
   the holding surface of the substrate stage includes a supply hole configured to supply a vacuum pressure to the plate, and
   the plate includes a support region configured to support the substrate, and a communication path with which the support region and the supply hole of the substrate stage communicate, and
   the plate supports the substrate by a vacuum pressure supplied from the supply hole to the support region via the communication path.

6. The method according to claim 5, wherein
   the holding surface of the substrate stage includes a plurality of holding regions where a holding force of the plate can be individually adjusted, and
   the supply hole is arranged between the plurality of holding regions.

7. The method according to claim 5, wherein
   the holding surface of the substrate stage includes a plurality of holding regions where a holding force of the plate can be individually adjusted, and
   the supply hole is arranged at a position surrounded by one holding region of the plurality of holding regions.

8. The method according to claim 1, wherein
   in each of the bringing the mold into contact with the imprint material on the substrate and the separating of the mold from the cured imprint material on the substrate, a gap between the mold and the holding surface of the substrate stage is controlled based on information concerning a height of the plate, such that the gap is offset by the height of the plate.

9. A method of manufacturing an article, the method comprising:
   forming a pattern on a substrate by using an imprint method according to claim 1;
   processing the substrate, on which the pattern has been formed, to manufacture the article.

10. An imprint apparatus that forms a pattern of an imprint material on a substrate using a mold, the apparatus comprising:
   a substrate stage configured to hold a plate having a dimension larger than a dimension of the substrate; and
   a controller configured to control bringing the mold into contact with the imprint material supplied onto the substrate, curing the imprint material on the substrate, and separating the mold from the cured imprint material,
   wherein the dimension of the substrate is smaller than a holding surface of the substrate stage, and the substrate is supported by the plate by being held by the holding surface via the plate, and
   the controller controls holding of the plate by the substrate stage while maintaining supporting of the substrate by the plate, such that the substrate is deformed into a convex shape together with the plate upon the separating of the mold from the cured imprint material on the substrate.

\* \* \* \* \*